United States Patent
Lee et al.

(10) Patent No.: US 9,236,216 B2
(45) Date of Patent: Jan. 12, 2016

(54) IN-VACUUM HIGH SPEED PRE-CHILL AND POST-HEAT STATIONS

(75) Inventors: William D. Lee, Newburyport, MA (US); William P. Reynolds, Canton, MA (US); Stanley W. Stone, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 13/566,013

(22) Filed: Aug. 3, 2012

(65) Prior Publication Data

US 2014/0034846 A1    Feb. 6, 2014

(51) Int. Cl.
| H01J 37/18 | (2006.01) |
| H01L 21/677 | (2006.01) |
| H01J 37/20 | (2006.01) |
| H01J 37/317 | (2006.01) |
| H01L 21/67 | (2006.01) |
| H01L 21/02 | (2006.01) |

(52) U.S. Cl.
CPC ............ *H01J 37/18* (2013.01); *H01J 37/20* (2013.01); *H01J 37/3171* (2013.01); *H01L 21/67109* (2013.01); *H01L 21/67201* (2013.01); *H01L 21/67213* (2013.01); *H01L 21/67742* (2013.01); *H01L 21/67766* (2013.01); *H01J 2237/2001* (2013.01); *H01J 2237/201* (2013.01); *H01J 2237/2002* (2013.01); *H01J 2237/204* (2013.01); *H01J 2237/2007* (2013.01); *H01J 2237/31705* (2013.01); *H01L 21/02002* (2013.01)

(58) Field of Classification Search
CPC .............................. H01L 21/67; H01J 37/18
USPC ..................................... 250/492.3; 279/106
See application file for complete search history.

(56) References Cited

U.S. PATENT DOCUMENTS

| 5,828,070 | A | | 10/1998 | Brailove et al. |
| 6,158,951 | A | * | 12/2000 | Carr et al. ............... 414/749.4 |
| 6,167,274 | A | * | 12/2000 | Smith ................. G01S 5/0036 342/357.4 |
| 6,597,964 | B1 | * | 7/2003 | Huang ............. H01L 21/67109 118/729 |
| 7,960,297 | B1 | * | 6/2011 | Rivkin et al. .............. 438/800 |
| 2002/0051704 | A1 | * | 5/2002 | Sundar et al. ............ 414/744.5 |
| 2003/0013213 | A1 | * | 1/2003 | Takano ............. G03F 7/70516 438/14 |
| 2005/0111938 | A1 | * | 5/2005 | van der Meulen ........... H01L 21/67161 414/217 |
| 2008/0044938 | A1 | * | 2/2008 | England et al. ............... 438/51 |
| 2008/0224491 | A1 | * | 9/2008 | Gillespie ............ B25J 15/0052 294/106 |
| 2011/0143461 | A1 | * | 6/2011 | Fish et al. ....................... 438/5 |
| 2012/0132412 | A1 | * | 5/2012 | Yamamoto ....... H01L 21/67109 165/287 |

FOREIGN PATENT DOCUMENTS

WO        WO 9411944 A1 *  5/1994

* cited by examiner

*Primary Examiner* — Jack Berman
*Assistant Examiner* — James Choi
(74) *Attorney, Agent, or Firm* — Eschweiler & Associates, LLC

(57) ABSTRACT

An ion implantation system provides ions to a workpiece positioned in a vacuum environment of a process chamber on a cooled chuck. A pre-chill station within the process chamber has a chilled workpiece support configured to cool the workpiece to a first temperature, and a post-heat station within the process chamber, has a heated workpiece support configured to heat the workpiece to a second temperature. The first temperature is lower than a process temperature, and the second temperature is greater than an external temperature. A workpiece transfer arm is further configured to concurrently transfer two or more workpieces between two or more of the chuck, a load lock chamber, the pre-chill station, and the post-heat station.

24 Claims, 6 Drawing Sheets

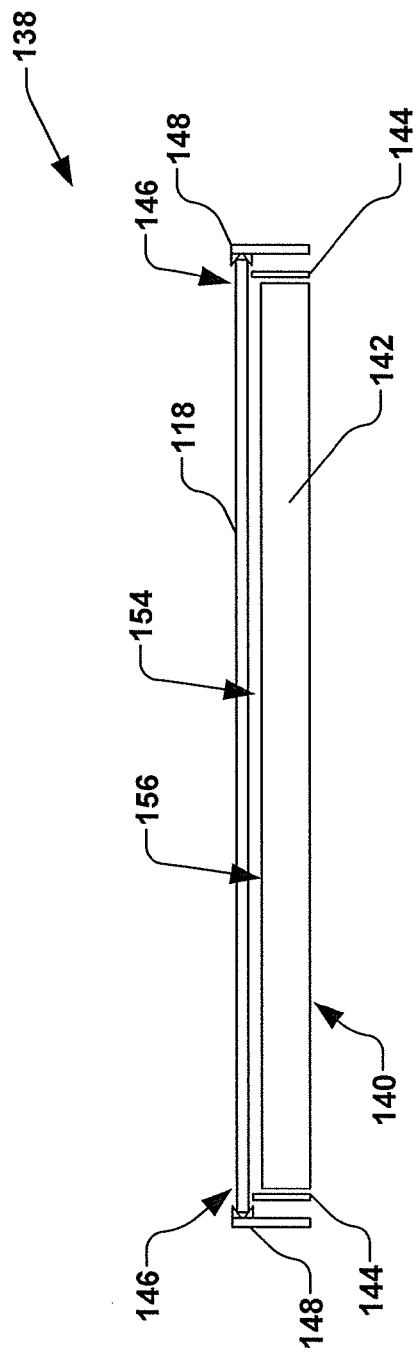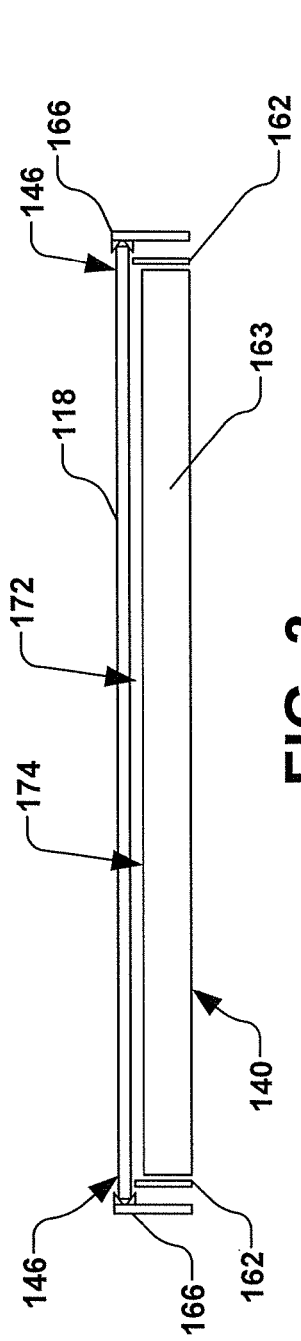

IN-VACUUM HIGH SPEED PRE-CHILL AND POST-HEAT STATIONS

TECHNICAL FIELD

The present invention relates generally to ion implantation systems, and more specifically to preventing condensation from forming on a workpiece in an ion implantation system.

BACKGROUND

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the chuck surface by electrostatic forces.

For certain ion implantation processes, cooling the workpiece via a cooling of the ESC is desirable. At colder temperatures, however, condensation can form on the workpiece, or even freezing of atmospheric water on the surface of the workpiece can occur, when the workpiece is transferred from the cold ESC in the process environment (e.g., a vacuum environment) to an external environment (e.g., a higher pressure, temperature, and humidity environment). For example, after an implantation of ions into the workpiece, the workpiece is typically transferred into a load lock chamber, and the load lock chamber is subsequently is vented. When the load lock chamber is opened to remove the workpiece therefrom, the workpiece is typically exposed to ambient atmosphere (e.g., warm, "wet" air at atmospheric pressure), wherein condensation can occur on the workpiece. The condensation can deposit particles on the workpiece, and/or leave residues on the workpiece that can have adverse effects on front side particles (e.g., on active areas), and can lead to defects and production losses.

Heating of the workpiece can be performed in order to attempt to alleviate the adverse effects of condensation; however, such heating often "soaks" the workpiece for a period of time on the ESC in order to reach a predetermined temperature, prior to transferring the wafer. Long soak times conventionally adversely affect workpiece throughput in the ion implantation system.

Therefore, a need exists in the art for an apparatus, system, and method for mitigating condensation on a workpiece while improving workpiece throughput when transferring a cold workpiece between a "dry" or evacuated environment and a "wet" or atmospheric environment.

SUMMARY

The present invention overcomes the limitations of the prior art by providing a system, apparatus, and method for abating condensation on a workpiece and maintaining reasonable process throughput in a chilled ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the present disclosure, an ion implantation system for implanting ions into a cold workpiece is provided. The ion implantation system, for example, comprises an ion implantation apparatus configured to provide a plurality of ions to a workpiece positioned in a process chamber, wherein the process chamber has a process environment associated therewith. In one example, a sub-ambient temperature chuck, such as a cryogenically cooled electrostatic chuck, is configured to support the workpiece within the process chamber during an exposure of the workpiece to the plurality of ions. The cryogenic chuck is further configured to cool the workpiece to a processing temperature, wherein the process temperature is below a dew point of an external environment.

According to one aspect, a load lock chamber is provided, wherein the load lock chamber is operably coupled to the process chamber and is configured to isolate the process environment from the external environment. The load lock chamber further comprises a workpiece support configured to support the workpiece during a transfer of the workpiece between the process chamber and the intermediate chamber.

A pre-chill station is further positioned within the process chamber, wherein the pre-chill station comprises a chilled workpiece support configured to cool the workpiece to a first temperature. In one example, the first temperature is significantly lower than the process temperature. The pre-chill station, for example, comprises a cooling plate configured to support the workpiece and to cool the workpiece to the first temperature. In another example, the pre-chill station further comprises a pre-chill gas sealing ring configured to support a periphery of the workpiece, a pre-chill clamp configured to maintain a position of the workpiece on the chilled workpiece support, and a pre-chill gas source configured to provide a pre-chill gas between a gas cooling space defined between the workpiece and a surface of the chilled workpiece support. A pressure of the pre-chill gas, for example, generally determines a cooling of the workpiece.

A post-heat station is also positioned within the process chamber, wherein the post-heat station comprises a heated workpiece support configured to heat the workpiece to a second temperature. The post-heat station, for example, comprises a heating station support comprising a heating plate configured to support the workpiece and to heat the workpiece to the second temperature. In another example, the post-heat station further comprises a post-heat gas sealing ring configured to support a periphery of the workpiece, a post-heat clamp configured to maintain a position of the workpiece on the heated workpiece support, and a post-heat gas source configured to provide a post-heat gas between a gas heating space defined between the workpiece and a surface of the heated workpiece support. Accordingly, a pressure of the post-heat gas generally determines a heating of the workpiece.

In one example, the chuck is diametrically opposed to the load lock chamber within the vacuum chamber, and the pre-chill station is diametrically opposed to the post-heat station within the vacuum chamber.

In another exemplary aspect, the chilled workpiece holding station is positioned within the process chamber, wherein the chilled workpiece holding station comprises a cold workpiece support configured to support the workpiece when the workpiece is at the first temperature. A heated workpiece holding station may be further positioned within the process chamber, wherein the heated workpiece holding station comprises a hot workpiece support configured to support the workpiece when the workpiece is at the second temperature. In another example, the chuck is diametrically opposed to the load lock chamber, the pre-chill station is diametrically opposed to the post-heat station, and the chilled workpiece holding station is diametrically opposed to the heated workpiece holding station within the vacuum chamber.

In accordance with another exemplary aspect of the disclosure, a workpiece transfer arm is configured to concurrently transfer two or more workpieces between two or more of the chuck, load lock chamber, pre-chill station, and post-heat station. The workpiece transfer arm, for example, comprises two pairs of workpiece transfer clamps positioned approximately 90 degrees from one another, wherein each pair of workpiece transfer clamps is diametrically opposed to each other. Each pair of workpiece transfer clamps is configured to concurrently grasp or release a workpiece from the chuck and load lock chamber, from the pre-chill station and post-heat station, and/or the chilled workpiece holding station and heated workpiece holding station, based on a rotational position of the workpiece transfer arm.

A controller may be further configured to determine the first temperature and the second temperature, based, at least in part, on a desired process throughput. A temperature monitoring system, for example, is configured to measure a temperature of the workpiece at the pre-chill station and the post-heat station. The controller is thus further configured to control cooling of the workpiece to the first temperature and the heating of the workpiece to the second temperature, based, at least in part, on the measured temperature of the workpiece.

According to another example in the disclosure, a method for implanting ions into a workpiece at sub-ambient temperatures is provided. A workpiece is provided in an external environment at an external temperature and external pressure and transferred from the external environment to the load lock chamber. The pressure within the load lock chamber is lowered to a substantial vacuum, and the workpiece is transferred from the load lock chamber to the pre-chill for cooling. The pre-chill station, for example, is cooled to the first temperature that is lower than a process temperature, thus quickly cooling the workpiece. The workpiece is then transferred from the pre-chill station to the chuck that is cooled to the process temperature.

Ions are implanted into the workpiece via an ion implantation apparatus, and the workpiece is subsequently transferred from the chuck to the post-heat station within the vacuum environment. The workpiece is heated at the post-heat station, wherein the post-heat station is heated to the second temperature that is greater than the external temperature, therein quickly heating the workpiece. The workpiece is then transferred from the post-heat station to the load lock chamber, the pressure within the load lock chamber is increased to the external pressure, and the workpiece is removed from the load lock chamber.

In one example, the workpiece is transferred from the load lock chamber to the pre-chill station occurs while concurrently transferring another workpiece from the chuck to the post-heat station. Likewise, in another example, the workpiece is transferred from the pre-chill station to the chuck occurs while concurrently transferring another workpiece from the post-heat station to the load lock chamber.

In another example, transferring the workpiece from the pre-chill station to the chuck comprises transferring the workpiece from the pre-chill station to the chilled workpiece holding station, and then transferring the workpiece from the chilled workpiece holding station to the chuck, while transferring the workpiece from the post-heat station to the load lock chamber comprises transferring the workpiece from the post-heat station to the heated workpiece holding station, and then transferring the workpiece from the heated workpiece holding station to the load lock chamber. Such transfers permit concurrent transfers of four workpieces via the workpiece transfer arm in a logical and throughput-sensitive manner.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2 is a cross-sectional view of an exemplary pre-chill station in accordance with another aspect of the disclosure.

FIG. 3 is a cross-sectional view of an exemplary post-heat station in accordance with yet another aspect of the disclosure.

DETAILED DESCRIPTION

Figure 1:
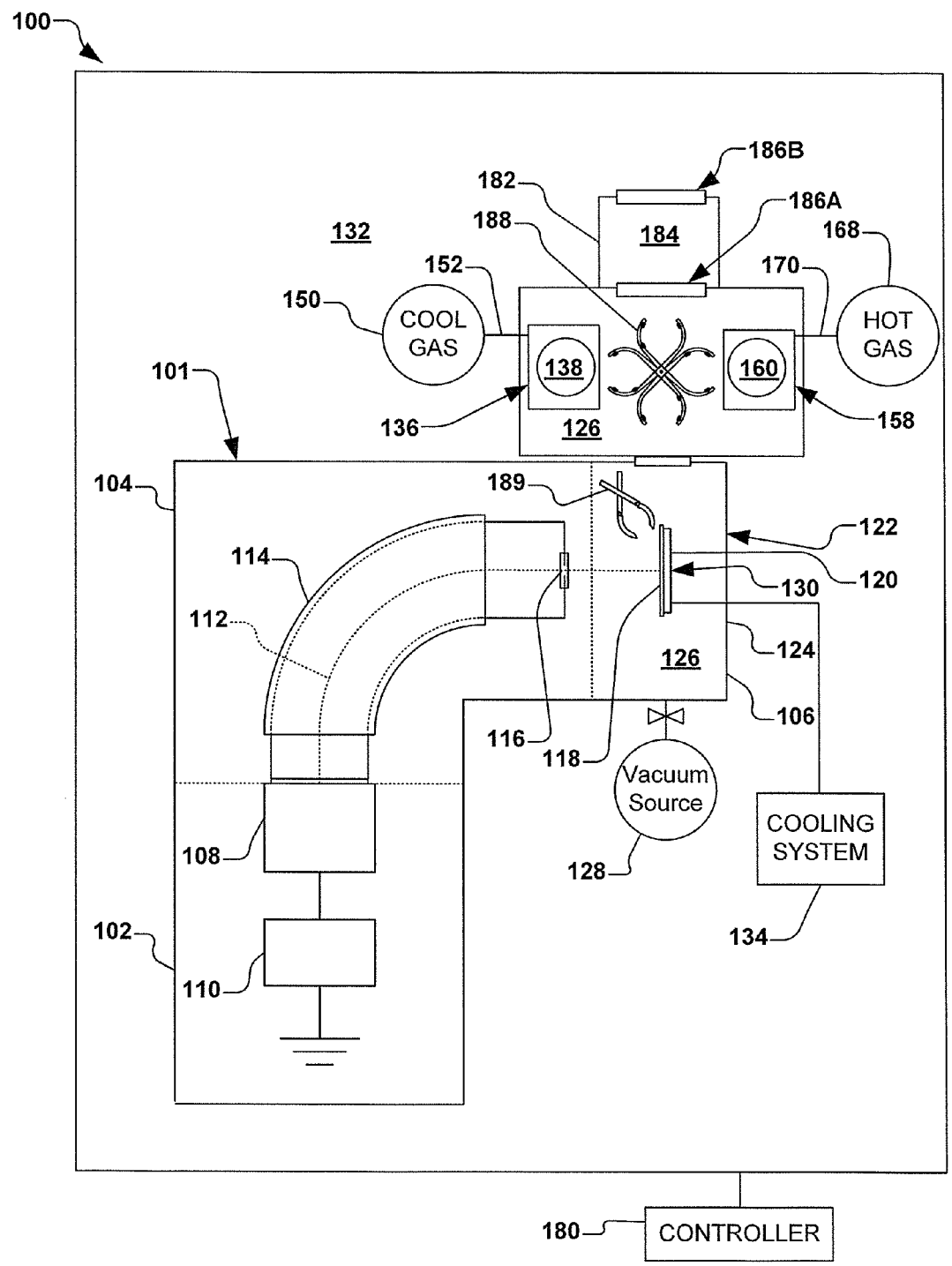
FIG. 1 is a block diagram of an exemplary vacuum system comprising an ion implantation system in accordance with several aspects of the present disclosure.

The present disclosure is directed generally toward a system, apparatus, and method for abating condensation on a workpiece and maintaining reasonable process throughput in a chilled ion implantation system. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

During an implantation utilizing the ion implantation system 101, energy can build up on the workpiece 118 in the form of heat, as the charged ions collide with the workpiece. Absent countermeasures, such heat can potentially warp or crack the workpiece 118, which may render the workpiece worthless (or significantly less valuable) in some implementations. The heat can further cause the dose of ions delivered to the workpiece 118 to differ from the dosage desired, which can alter functionality from what is desired. Furthermore, in some circumstances, it is desirable to not only cool the workpiece 118 during implantation to prevent heat build-up, but it may be further desirable to implant ions at a temperature below or above an ambient temperature, such as to allow for desirable amorphization of the surface of the workpiece 118 enabling, among other things, ultra-shallow junction formation in advanced CMOS integrated circuit device manufacturing.

Thus, in accordance with another example, the chuck 120 comprises a sub-ambient temperature chuck 130, wherein the sub-ambient temperature chuck is configured to both support and cool or otherwise maintain a predetermined temperature on the workpiece 118 within the process chamber 122 during the exposure of the workpiece to the ion beam 112. It should be noted that while the chuck 120 is referred to in the present example as being the sub-ambient temperature chuck 130, the chuck 120 can likewise comprise a super-ambient temperature chuck (not shown), wherein the super-ambient temperature chuck is configured to support and heat the workpiece 118 within the process chamber 122.

The sub-ambient temperature chuck 130, for example, is an electrostatic chuck configured to cool or chill the workpiece 118 to a processing temperature that is considerably lower than an ambient or atmospheric temperature of the surroundings or external environment 132 (e.g., also called an "atmospheric environment"). Likewise, in a case where the chuck 120 comprises the above-described super-ambient temperature chuck, the super-ambient temperature chuck may comprise an electrostatic chuck configured to heat the workpiece 118 to a processing temperature that is considerably higher than the ambient or atmospheric temperature of the surroundings or external environment 132. A cooling system 134 may be further provided, wherein, in another example, the cooling system is configured to cool or chill the sub-ambient temperature chuck 130, and thus, the workpiece 118 residing thereon, to the processing temperature. In another example, and in a similar manner, a heating system (not shown) may be further provided in the case of a super-ambient temperature chuck, wherein the heating system is configured to heat the super-ambient temperature chuck and workpiece 118 residing thereon to the processing temperature.

In some exemplary operations of the vacuum system 100, the processing temperature is below the ambient dew point (e.g., 8 degrees C., also called dew point temperature) of the external environment 132, such as a processing temperature of approximately −40 degrees C. In such an operation, since the processing temperature is significantly lower than the dew point temperature of the external environment 132, without warming of the workpiece 118 prior to exposure to the external environment, condensation may form thereon, thus potentially deleteriously affecting the workpiece, as will be discussed in greater detail hereafter.

However, the inventors appreciate that cooling of the workpiece 118 can deleteriously affect cycle time through the vacuum system 100, wherein conventionally, the workpiece is allowed to "soak" on the chuck 120 until the desired temperature is reached. In order to increase process throughput, the present disclosure thus provides a pre-chill station 136 positioned within the vacuum environment 126 of the process chamber 120. The pre-chill station 136, for example, comprises a chilled workpiece support 138, as illustrated further in FIG. 2, wherein the chilled workpiece support 138 is configured to cool the workpiece to a first temperature.

The chilled workpiece support 138, for example, comprises a thermal pad 140, such as a cooling plate 142, wherein the thermal pad is configured to support the workpiece and to cool the workpiece to the first temperature. The thermal pad 140, for example, comprises a cooling plate 142 comprising one or more of a peltier cooler, an expansion chamber, a cryogenic head, and a circulatory refrigeration loop.

In another exemplary aspect, the pre-chill station 136 of FIG. 1 further comprises a pre-chill gas sealing ring 144, as illustrated again in FIG. 2, wherein the pre-chill gas sealing ring is generally disposed about a perimeter of the chilled workpiece support 138. The pre-chill gas sealing ring 144, for example, is configured to support a periphery 146 of the workpiece 118, and to generally provide a seal between the workpiece and the chilled workpiece support 138. According to another example, a pre-chill clamp 148 is further provided, wherein the pre-chill clamp is configured to maintain a position of the workpiece 118 on the chilled workpiece support 138. As illustrated again in FIG. 1, a pre-chill gas source 150 is further provided, wherein the pre-chill gas source is configured to provide a pre-chill gas 152 between a gas cooling space 154 illustrated in FIG. 2, wherein the gas cooling space is defined between the workpiece 118 and a surface 156 of the chilled workpiece support 138. As such, a pressure of the pre-chill gas 152 within the gas cooling space 154 is configured to generally determine a cooling of the workpiece 118.

The rate of heat transfer between the workpiece 118 and the chilled workpiece support 138 is generally proportional to the temperature difference between the workpiece and the chilled workpiece support. In general, $$T(t) = T_\infty + (T_0 - T_\infty) e^{(-t/\tau)} \quad (1)$$

where $T(t)$ is the temperature of the workpiece 118 being cooled or heated as a function of time, $T_\infty$ is the temperature of object doing the cooling or heating, which in this case, is the chilled workpiece support 138, $T_0$ is the initial temperature of the workpiece, e is the Euler number (2.71828 . . . ), t is time, and $\tau$ a time constant which depends, among other factors, on the heat transfer coefficient. As will be understood from equation (1), it is substantially quicker to get the workpiece 118 to a predetermined temperature when the temperature of the chilled workpiece support 138 is overdriven to a first temperature that is lower than the processing temperature. In one example, the first temperature is at least an order of magnitude lower than the process temperature. For example, if a process temperature of −40 C is desired, it would take many time constants to be acceptably close to −40 C if the chilled workpiece support 138 were held at −40 C. However, if the chilled workpiece support 138 is driven to a first temperature of −100 C, for example, the desired process temperature of −40 C could be achieved in just over half a time constant. As such, the chilled workpiece support 138 is configured to cool at the first temperature, wherein the first temperature is significantly lower than the desired processing temperature.

In still another exemplary aspect, the post-heat station 158 of FIG. 1 is further positioned within the vacuum environment 126 of the process chamber 122, wherein the post-heat station further comprises a heated workpiece support 160, as illustrated in FIG. 3, configured to heat the workpiece 118 to a second temperature. The heated workpiece support 160, for example, comprises another thermal pad 140, such as a heating plate 161, wherein the thermal pad is configured to support the workpiece and to heat the workpiece to the second temperature. The post-heat station 158 for example, further comprises a post-heat gas sealing ring 162, wherein the post-heat gas sealing ring is generally disposed about a perimeter 164 of the heated workpiece support 160. The post-heat gas sealing ring 162, for example, is configured to support the periphery 146 of the workpiece 118, and to generally provide a seal between the workpiece and the heated workpiece support 160.

According to another example, a post-heat clamp 166 is further provided, wherein the post-heat clamp is configured to maintain a position of the workpiece 118 on the heated workpiece support 160. As illustrated again in FIG. 1, a post-heat gas source 168 is further provided, wherein the post-heat gas source is configured to provide a post-heat gas 170 between a gas heating space 172 illustrated in FIG. 3, wherein the gas heating space is defined between the workpiece 118 and a surface 174 of the heated workpiece support 138. As such, a pressure of the post-heat gas 170 within the gas heating space 172 is configured to generally determine a heating of the workpiece 118.

Similar to the cooling described above, heating of the workpiece 118 in the post-heat station 158 of FIG. 1 can be overdriven, wherein the second temperature is significantly greater than the processing temperature. As such, a time needed to heat the workpiece back to the external temperature of the external environment 132 can be significantly reduced by the present disclosure. In one exemplary aspect of the disclosure, the post-heat station 158 and pre-chill station 136 are generally isolated from one another within the process chamber 122, wherein heat transfer between the post-heat station and pre-chill station is minimized. In one example, the second temperature is no greater than 100 C to approximately 150 C, wherein stability of a conventional photoresist begins to decay.

Figure 4:
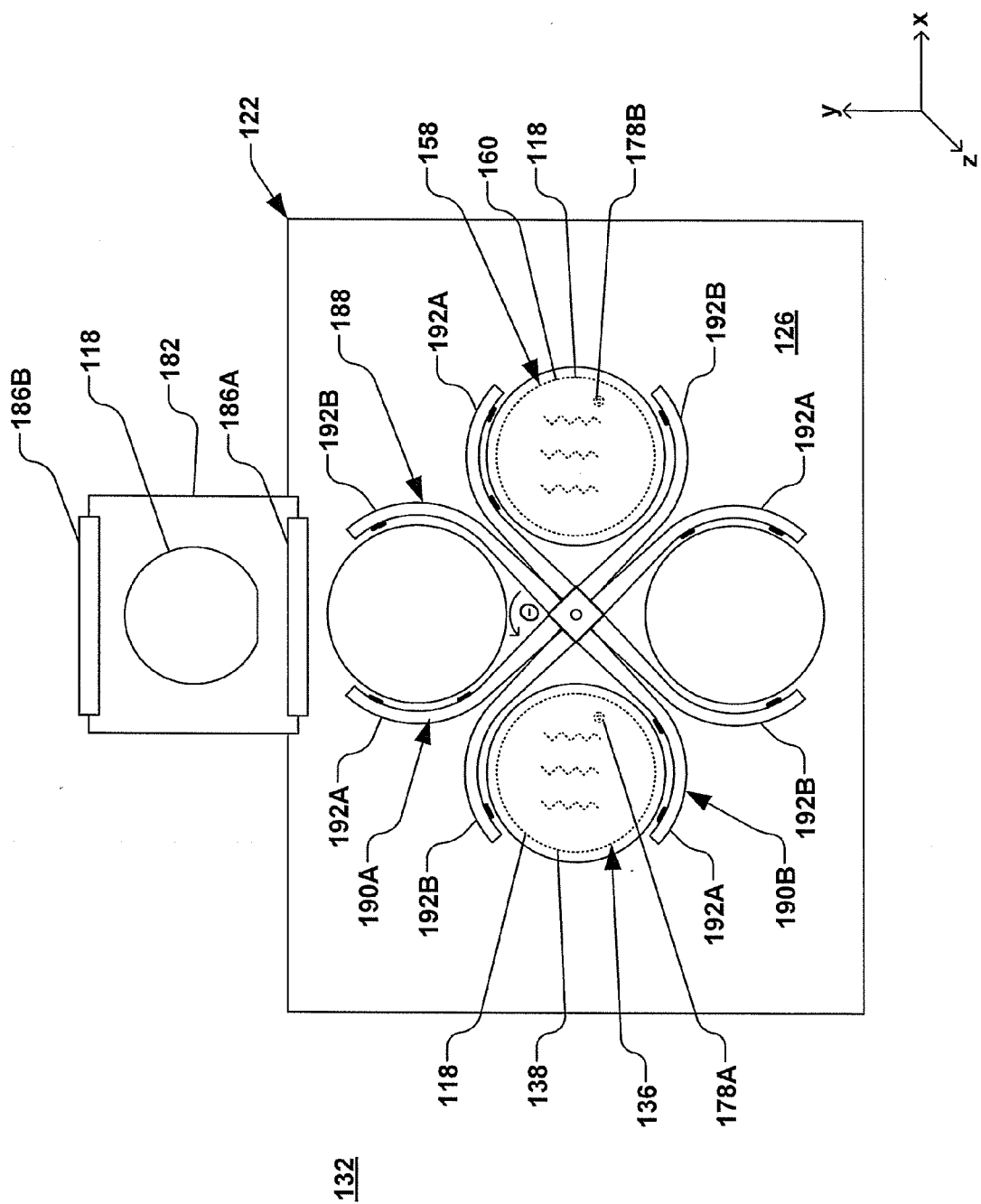
FIG. 4 illustrates a process chamber in accordance with another exemplary aspect of the disclosure.

In accordance with another example, a temperature monitoring system 176 is further provided, and configured to measure a temperature of the workpiece 118 at the pre-chill station 136 and the post-heat station 158, as illustrated in FIG. 4. The temperature monitoring system 176, for example, comprises one or more workpiece temperature monitoring devices 178A, 178B configured to measure a temperature of the workpiece 118 residing on the respective pre-chill station 136 and the post-heat station 158, thus monitoring the temperature of the workpiece during cooling and heating thereof, and improving process efficiencies. A controller 180 illustrated in FIG. 1, for example, is further configured to control cooling of the workpiece 118 to the first temperature and the heating of the workpiece to the second temperature, based, at least in part, on the measured temperature of the workpiece.

In accordance with another aspect, referring again to FIG. 1, a load lock chamber 182 is further operably coupled to the process chamber 122, wherein the load lock chamber is configured to isolate the process environment 126 from the external environment 132. The load lock chamber 182 further comprises a workpiece support 184 configured to support the workpiece 118 during a transfer of the workpiece between the process chamber 122 and the external environment 132. A plurality of load lock doors 186A, 186B operably couple the load lock chamber 182 to the respective process chamber 122 and the external environment 132.

In accordance with still another aspect of the disclosure, a workpiece transfer arm 188 is provided, wherein the workpiece transfer arm is configured to concurrently transfer two or more workpieces 118 between two or more of the chuck 120, load lock chamber 182, pre-chill station 136, and post-heat station 158. One or more auxiliary transfer arms 189 may be further provided to assist in transferring workpieces, in accordance with another example. The workpiece transfer arm 188, as illustrated in greater detail in FIG. 4, comprises two pairs 190A, 190B of workpiece transfer clamps 192A, 192B positioned approximately 90 degrees from one another, wherein each pair of workpiece transfer clamps is diametrically opposed to each other. Each pair 190A, 190B of workpiece transfer clamps 192A, 192B is configured to concurrently grasp or release a workpiece 118 from the chuck 120 and load lock chamber 182, or from the pre-chill station 136 and post-heat station 158, based on a rotational position of the workpiece transfer arm 188.

Figure 5A:
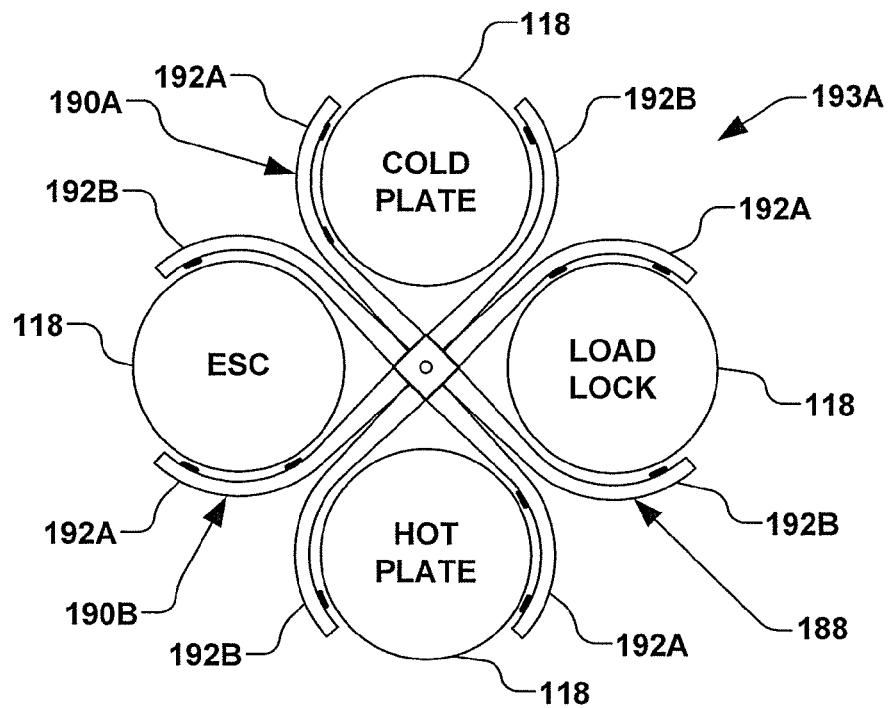
FIGS. 5A and 5B illustrate an exemplary workpiece transfer arm in respective open and closed positions in accordance with still another aspect of the disclosure.
Figure 5B:
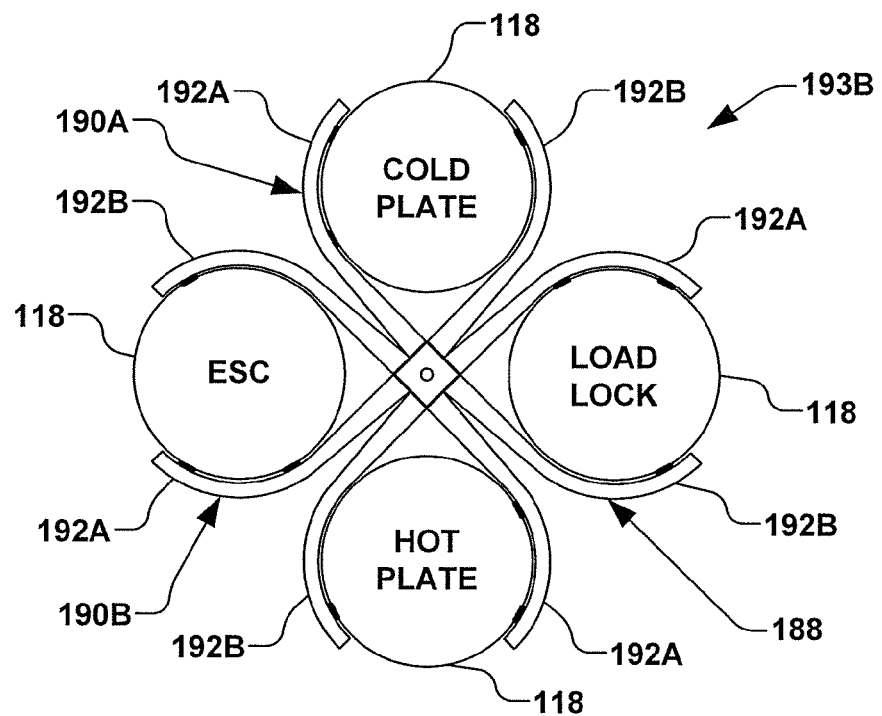

The workpiece transfer arm 188, for example, has the ability to rotate (e.g., Θ) as well as to move in and out (e.g., in the z-direction). The workpiece transfer arm 188, for example, is part of an assembly (not shown) comprised of two arms that rotate together and can be opened and close like scissors, in order to effectuate gripping and releasing workpieces 118. For example, FIG. 5A illustrates the two pairs 190A, 190B of workpiece transfer clamps 192A, 192B in an open position 193A, wherein the workpiece transfer clamps are operable to generally surround, but not contact the two or more workpieces 118. In the example of FIG. 5B, the workpiece transfer clamps 192A, 192B are in a closed position 193B, wherein the workpiece transfer clamps are positioned to contact and concurrently grip the two or more workpieces 118.

Figure 6:
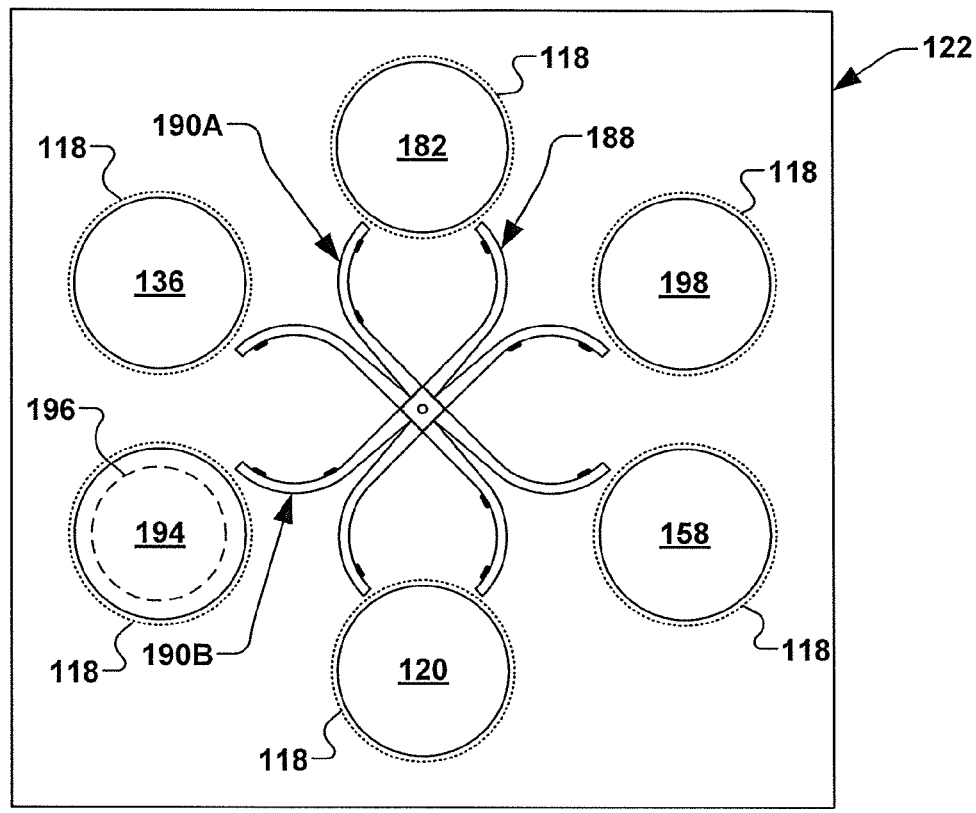
FIG. 6 is a schematic view of another exemplary process chamber in accordance with another aspect of the disclosure.

According to still another aspect, as illustrated schematically in FIG. 6, a chilled workpiece holding station 194 is positioned within the process chamber 122, wherein the chilled workpiece holding station comprises a cold workpiece support 196 configured to support the workpiece 118 once the workpiece is at the first temperature in the pre-chill station 136. The cold workpiece support 196, for example, is further configured to maintain the temperature of the workpiece 118 while the workpiece resides on the cold workpiece support 196. A heated workpiece holding station 198 is further positioned within the process chamber 122, wherein the heated workpiece holding station comprises a hot workpiece support 199 configured to support the workpiece 118 when the workpiece is at the second temperature. The hot workpiece support 199, for example, is further configured to maintain the temperature of the workpiece 118 while the workpiece resides on the hot workpiece support 199.

As illustrated in the example of FIG. 6, the chuck 120 is diametrically opposed to the load lock chamber 182, the pre-chill station 136 is diametrically opposed to the post-heat station 158, and the chilled workpiece holding station 194 is diametrically opposed to the heated workpiece holding station 198 within the process chamber 122. It should be noted that various other configurations and locations of the chuck 120, load lock chamber 182, pre-chill station 136, post-heat station 158, chilled workpiece holding station 194, and heated workpiece holding station 198 within the process chamber 122 are contemplated as falling within the scope of the present disclosure. For example, the chilled workpiece holding station 194 may be positioned opposite the pre-chill station 136, and the heated workpiece holding station 198 may be positioned opposite the post-heat station 158. Such a configuration may provide an advantageous flow of workpieces 118, depending on the configuration of the workpiece transfer arm 188. Further, for simplicity, the load lock chamber 182 is illustrated as being within the process chamber 122; however, it should be understood that the load lock door 186A of FIG. 4 operably couples the load lock chamber 182 to process chamber.

An exemplary flow scheme or transference of workpieces 118 in association with the vacuum system 100 of FIG. 1 will now be briefly discussed in order to provide one of many operational examples of an operation of the vacuum system. It should be noted that the present disclosure is not limited to the exemplary flow provided, and that various other transferences of workpieces 118 into, out of, and within the vacuum system 100 are contemplated as falling within the scope of the present disclosure.

Figure 7:
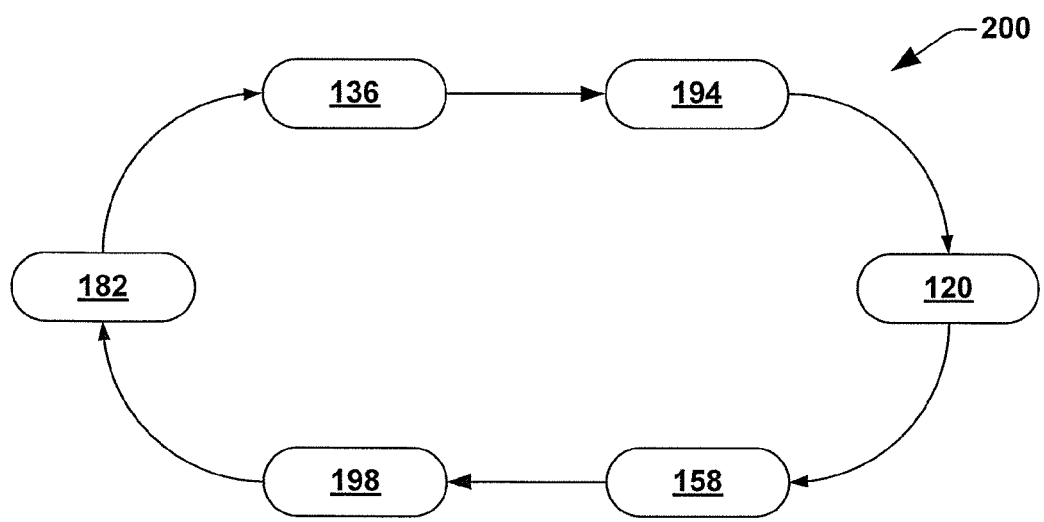
FIG. 7 illustrates an exemplary flow of workpieces through a chilled ion implantation system in accordance with another aspect of the disclosure.

In one exemplary workpiece flow 200, as illustrated in FIG. 7, the workpiece 118 of FIG. 6, for example, is transferred out of the load lock chamber 182 to one of the pre-chill station 136 and pre-heat station 158 within the process chamber 122, depending on whether a sub-ambient or super-ambient implantation is desired. For example, in a sub-ambient implantation (e.g., an implantation at a temperature below ambient temperature), the workpiece 118 is transferred to the pre-chill station 136, wherein the workpiece is pre-chilled to approximately the processing temperature. Once cooled via the pre-chill station 136 (or heated via the pre-heat station 158) to approximately the processing temperature, the workpiece 118 is either transferred to the chuck 120 for appropriate implantation of ions according to process requirements, or transferred to the chilled workpiece holding station 194, to wait for subsequent transfer to the chuck.

Once the implantation is complete, the workpiece 118 is removed from the chuck 120 and transferred to one of the pre-chill station 136 and pre-heat station 158, again depending on whether a sub-ambient or super-ambient implantation is desired. In the above sub-ambient implantation example, the workpiece 118 is transferred to the pre-heat station 158, wherein in the present example, the workpiece is heated to a temperature greater than the dew point temperature of the external environment 132, as described above. Once heated appropriately, the workpiece 118 is transferred back to the load lock chamber 182, or transferred to the heated workpiece holding station 198. It should be noted that the workpiece transfer arm 188 of FIGS. 1, 4, 5A-5B, and 6 is configured to transfer two or more workpieces 118 concurrently between the load lock chamber 182, chuck 120, pre-chill station 136 and pre-heat station 158, as described above.

Figure 8:
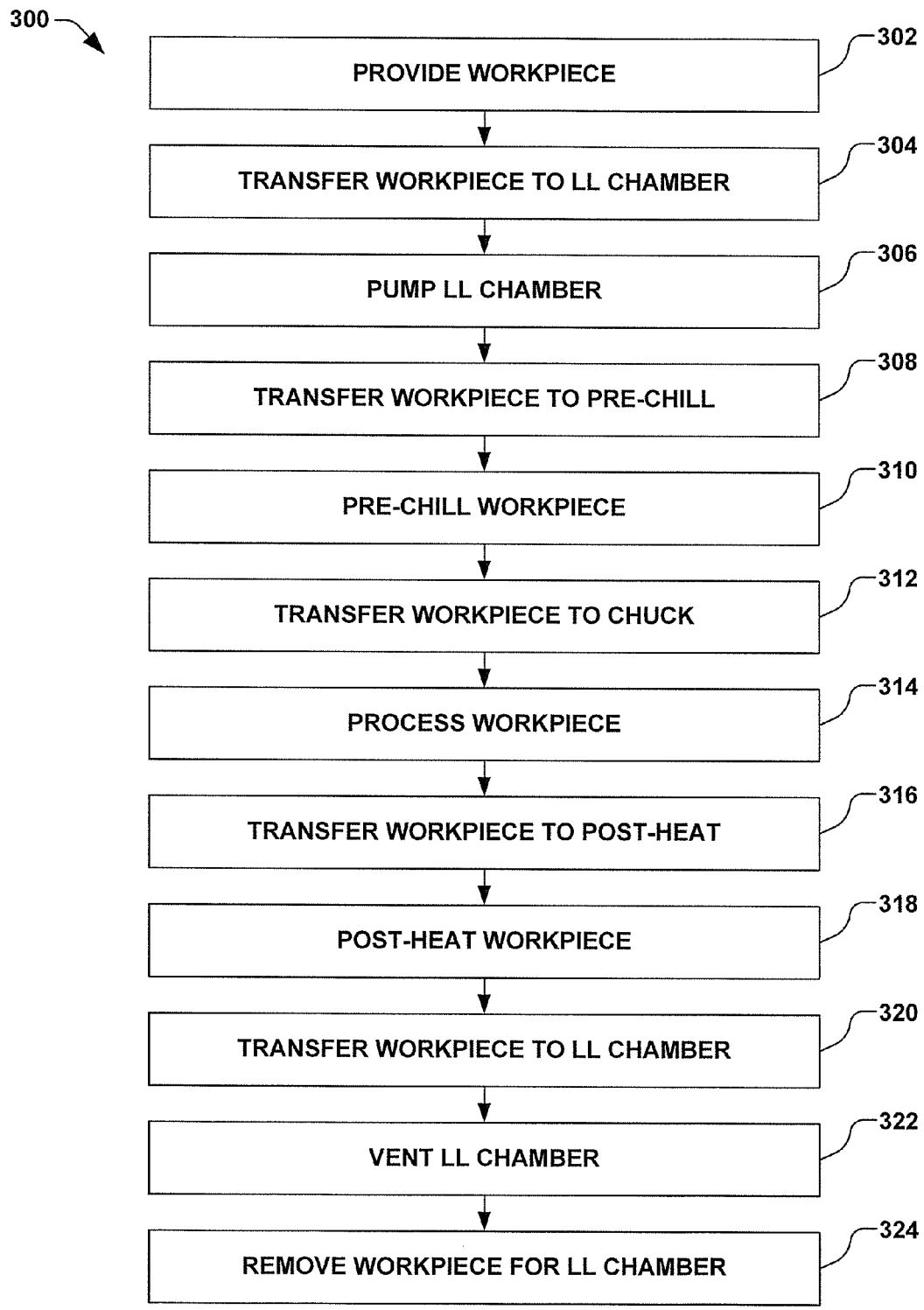
FIG. 8 illustrates a methodology for implanting ions into a workpiece at sub-ambient temperatures, in accordance with to still another aspect.

In accordance with another exemplary aspect of the invention, FIG. 8 illustrates an exemplary method 300 is provided for processing a workpiece at sub-ambient temperatures. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 300 of FIG. 8 begins at act 302, wherein a first workpiece is provided in an external environment at an external temperature and external pressure. In act 304, the first workpiece is transferred from the external environment to a load lock chamber, and in act 306, the pressure within the load lock chamber is lowered to a substantial vacuum. The first workpiece is transferred from the load lock chamber to pre-chill station within a vacuum environment of a process chamber in a cold implant ion implantation system in act 308, the first workpiece is cooled at the pre-chill station in act 310. The pre-chill station, for example, is cooled to a first temperature that is lower than a process temperature. Cooling of the workpiece in act 310, for example, comprises clamping the workpiece to a chilled workpiece support and providing a backside gas at the first temperature to a backside of the workpiece.

In act 312, the first workpiece is transferred from the pre-chill station to a chuck that is cooled to the process temperature, and the workpiece is processed, such as having ions implanted therein, in act 314. In accordance with one example, transferring the workpiece from the pre-chill station to the chuck in act 312 further comprises transferring the workpiece from the pre-chill station to a chilled workpiece holding station, and further transferring the workpiece from the chilled workpiece holding station to the chuck.

The first workpiece is then transferred from the chuck to a post-heat station within the vacuum environment in act 316, and the first workpiece is heated at the post-heat station in act 318, wherein the post-heat station is heated to a second temperature that is greater than the external temperature. Heating the workpiece in act 318, for example, comprises clamping the workpiece to a heated workpiece support and providing a backside gas at the second temperature to a backside of the workpiece.

The first workpiece is then transferred in act 320 from the post-heat station to the load lock chamber, and the pressure within the load lock chamber is increased to the external pressure in act 322. In accordance with one other example, transferring the workpiece from the post-heat station to the load lock chamber in act 320 further comprises transferring the workpiece from the post-heat station to a heated workpiece holding station, and further transferring the workpiece from the heated workpiece holding station to the load lock chamber. The workpiece can then be removed from the load lock chamber in act 324.

In accordance with one example, transferring the first workpiece from the load lock chamber to the pre-chill station act 308 occurs while concurrently transferring a second workpiece from the chuck to the post-heat station in act 318. Likewise, transferring the workpiece from the pre-chill station to the chuck in act 312 occurs while concurrently transferring a third workpiece from the post-heat station to the load lock chamber, and so on. Thus, a continuous transfer of workpieces from the load lock chamber to the pre-chill station, to the chilled workpiece holding station, to the chuck, to the post-heat station, to the heated workpiece holding station, and back to the load lock chamber can be achieved by the present disclosure. Further, the workpiece transfer arm 188 of FIGS. 1, 4, 5A-5B, and 6 can advantageously transfer two or more workpieces 118 concurrently between the load lock chamber 182, chuck 120, pre-chill station 136 and pre-heat station 158, as illustrated in FIGS. 4, 5A, and 5B. In an additional example, the workpiece transfer arm 188 can additionally transfer workpieces between the chilled workpiece holding station 194 and heated workpiece holding station 198 of FIGS. 6 and 7, as described above, therein advantageously increasing throughput, while optimally providing appropriate heating and cooling of the workpieces to prevent condensation.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
   a process chamber having a process environment associated therewith that is substantially evacuated;
   an ion implantation apparatus configured to provide a plurality of ions to a workpiece positioned in the process chamber;
   a chuck configured to support the workpiece within the process chamber during an exposure of the workpiece to the plurality of ions, wherein the chuck is configured to cool the workpiece to a processing temperature;
   a load lock chamber operably coupled to the process chamber, wherein the load lock chamber is configured to isolate the process environment from an external environment, and wherein the load lock chamber comprises a workpiece support configured to support the workpiece during a transfer of the workpiece between the process chamber and external environment; and
   a pre-chill station positioned within the process chamber, wherein the pre-chill station comprises a chilled workpiece support that is separate from the chuck and is configured to cool the workpiece to a first temperature;
   a chilled workpiece holding station positioned within the process chamber, wherein the chilled workpiece holding station comprises a cold workpiece support configured to receive and support the workpiece transferred thereto from the pre-chill station, and wherein the cold workpiece support is further configured to maintain the first temperature of the workpiece while the workpiece resides thereon;
   a post-heat station positioned within the process chamber and in continuous fluid communication with the process environment, wherein the post-heat station comprises a heated workpiece support configured to heat the workpiece to a second temperature;
   a heated workpiece holding station positioned within the process chamber, wherein the heated workpiece holding station comprises a hot workpiece support configured to receive and support the workpiece transferred thereto from the post-heat station, and wherein the hot workpiece support is further configured to maintain the second temperature of the workpiece while the workpiece resides thereon; and
   a workpiece transfer arm, wherein the workpiece transfer arm is configured to concurrently transfer two or more workpieces between two or more of the chuck, load lock chamber, chilled workpiece holding station, heated workpiece holding station, pre-chill station, and post-heat station.

2. The ion implantation system of claim 1, wherein the chuck comprises an electrostatic chuck configured to cool the workpiece to the processing temperature.

3. The ion implantation system of claim 1, wherein the workpiece transfer arm is configured to concurrently grasp or release a respective workpiece from the chuck and load lock chamber, the chilled workpiece holding station and heated workpiece holding station, or the pre-chill station and post-heat station, based on a rotational position of the workpiece transfer arm.

4. The ion implantation system of claim 1, wherein the first temperature is lower than the process temperature.

5. The ion implantation system of claim 1, wherein the pre-chill station comprises a cooling plate configured to support the workpiece and to cool the workpiece to the first temperature, and wherein the workpiece transfer arm is configured to transfer the workpiece to and from the cooling plate.

6. The ion implantation system of claim 5, wherein the cooling plate comprises one or more of a peltier cooler, an expansion chamber, a cryogenic head, and a circulatory refrigeration loop.

7. The ion implantation system of claim 5, wherein the pre-chill station further comprises:
a pre-chill gas sealing ring disposed about a perimeter of the chilled workpiece support, wherein the pre-chill gas sealing ring is configured to support a periphery of the workpiece;
a pre-chill clamp configured to maintain a position of the workpiece on the chilled workpiece support; and
a pre-chill gas source configured to provide a pre-chill gas between a gas cooling space defined between the workpiece and a surface of the chilled workpiece support, wherein a pressure of the pre-chill gas generally determines a cooling of the workpiece.

8. The ion implantation system of claim 1, wherein the post-heat station comprises a heating station support comprising a heating plate configured to support the workpiece and to heat the workpiece to the second temperature, and wherein the workpiece transfer arm is configured to transfer the workpiece to and from the heating plate.

9. The ion implantation system of claim 8, wherein the post-heat station further comprises:
a post-heat gas sealing ring disposed about a perimeter of the heated workpiece support, wherein the post-heat gas sealing ring is configured to support a periphery of the workpiece;
a post-heat clamp configured to maintain a position of the workpiece on the heated workpiece support; and
a post-heat gas source configured to provide a post-heat gas between a gas heating space defined between the workpiece and a surface of the heated workpiece support, wherein a pressure of the post-heat gas generally determines a heating of the workpiece.

10. The ion implantation system of claim 1, wherein the chuck is diametrically opposed to the load lock chamber, the pre-chill station is diametrically opposed to the post-heat station, and the chilled workpiece holding station is diametrically opposed to the heated workpiece holding station within the process chamber.

11. The ion implantation system of claim 10, wherein the workpiece transfer arm comprises two pairs of workpiece transfer clamps positioned approximately 90 degrees from one another, wherein each pair of workpiece transfer clamps is diametrically opposed to each other, and wherein each pair of workpiece transfer clamps is configured to respectively concurrently grasp or release a respective workpiece from the chuck and load lock chamber, from the pre-chill station and post-heat station, or from the chilled workpiece holding station and heated workpiece holding station, based on a rotational position of the workpiece transfer arm.

12. The ion implantation system of claim 1, wherein the chuck is diametrically opposed to the load lock chamber, and the pre-chill station is diametrically opposed to the post-heat station within the process chamber.

13. The ion implantation system of claim 1, wherein the workpiece transfer arm comprises at least one pair of workpiece transfer clamps configured to individually rotate about an axis, wherein the at least one pair of workpiece transfer clamps are configured to concurrently grasp or release a respective workpiece from the chuck and load lock chamber, from the chilled workpiece holding station and heated workpiece holding station, or from the pre-chill station and post-heat station, based on a rotational position of the at least one pair of workpiece transfer clamps.

14. The ion implantation system of claim 1, wherein the post-heat station and pre-chill station are generally isolated from one another within the process chamber.

15. The ion implantation system of claim 1, further comprising a controller configured to determine the first temperature and the second temperature, based, at least in part, on a desired process throughput.

16. The ion implantation system of claim 15, further comprising a temperature monitoring system configured to measure a temperature of the workpiece at the pre-chill station and the post-heat station, wherein the controller is further configured to control cooling of the workpiece to the first temperature and the heating of the workpiece to the second temperature, based, at least in part, on the measured temperature of the workpiece.

17. A method for implanting ions into a workpiece at sub-ambient temperatures, the method comprising:
providing a workpiece in an external environment at an external temperature and external pressure;
providing a workpiece transfer arm comprising at least one pair of workpiece transfer clamps that are diametrically opposed to each other and configured to open and close in a scissor-like manner, therein being configured to selectively grip and release a periphery of two or more workpieces;
transferring the workpiece from the external environment to a load lock chamber;
lowering the pressure within the load lock chamber to a substantial vacuum;
transferring the workpiece from the load lock chamber to pre-chill station within a vacuum environment of a process chamber in a cold implant ion implantation system via the workpiece transfer arm;
cooling the workpiece at the pre-chill station, wherein the pre-chill station is cooled to a first temperature that is lower than a process temperature;
transferring the workpiece from the pre-chill station to a cold workpiece support in a chilled workpiece holding station within the vacuum environment via the workpiece transfer arm;
maintaining the first temperature of the workpiece via the cold workpiece support while the workpiece resides on the cold workpiece support;
transferring the workpiece from the pre-chill chilled workpiece holding station to a chuck that is cooled to the process temperature within in the vacuum environment via the workpiece transfer arm;

implanting ions into the workpiece;
transferring the workpiece from the chuck to a post-heat station within the vacuum environment via the workpiece transfer arm;
heating the workpiece at the post-heat station, wherein the post-heat station is heated to a second temperature that is greater than the external temperature;
transferring the workpiece from the post-heat station to a hot workpiece support in a heated workpiece holding station within the vacuum environment via the workpiece transfer arm;
maintaining the second temperature of the workpiece via the hot workpiece support while the workpiece resides on the hot workpiece support;
transferring the workpiece from the post h at heated workpiece holding station to the load lock chamber via the workpiece transfer arm;
increasing the pressure within the load lock chamber to the external pressure; and
removing the workpiece from the load lock chamber.

18. The method of claim 17, wherein cooling the workpiece at the pre-chill station comprises clamping the workpiece to a chilled workpiece support and providing a backside gas at the first temperature to a backside of the workpiece.

19. The method of claim 17, wherein heating the workpiece at the post-heat station comprises clamping the workpiece to a heated workpiece support and providing a backside gas at the second temperature to a backside of the workpiece.

20. The method of claim 17, wherein the first temperature is at least an order of magnitude lower than the process temperature and the second temperature is not more than approximately 150 C.

21. The method of claim 17, wherein transferring the workpiece from the load lock chamber to the pre-chill station occurs while concurrently transferring a second workpiece from the chuck to the post-heat station.

22. The method of claim 21, wherein transferring the workpiece from the pre-chill station to the chuck occurs while concurrently transferring the second workpiece from the post-heat station to the load lock chamber.

23. The method of claim 17, wherein transferring the workpiece comprises concurrently transferring two or more-workpieces.

24. The ion implantation system of claim 1, wherein the workpiece transfer arm is further configured to concurrently grasp and release two workpieces disposed at respective diametrically opposed ends of the workpiece transfer arm, and wherein the workpiece transfer arm comprises two arms configured to selectively rotate in unison about an axis and to selectively open and close in a scissor-like manner by individually rotating about the axis, wherein in an open position, the two arms are configured to generally surround, but not contact the two workpieces, and wherein in a closed position, the two arms are configured to contact and concurrently grip the two workpieces.

* * * * *

UNITED STATES PATENT AND TRADEMARK OFFICE
CERTIFICATE OF CORRECTION

PATENT NO.         : 9,236,216 B2                              Page 1 of 1
APPLICATION NO.    : 13/566013
DATED              : January 12, 2016
INVENTOR(S)        : William D. Lee et al.

It is certified that error appears in the above-identified patent and that said Letters Patent is hereby corrected as shown below:

Claims

Column 14, Claim 17, Line 64 Please replace "...from the pre-chill chilled..."
with --...from the chilled...--

Column 15, Claim 17, Line 16 Please replace "...from the post h at heated..."
with --...from the heated...--

Signed and Sealed this
Twelfth Day of April, 2016

Michelle K. Lee
*Director of the United States Patent and Trademark Office*